United States Patent [19]

Hosotani et al.

[11] Patent Number: 5,075,688
[45] Date of Patent: Dec. 24, 1991

[54] BINARY SIGNAL GENERATING CIRCUIT WITH PARALLEL SAMPLE AND HOLD CIRCUITS AND COMMON SAMPLING SWITCH

[75] Inventors: Shiro Hosotani; Takahiro Miki, both of Hyogo, Japan

[73] Assignee: Mitsubishi Denki Kabushika Kaisha, Tokyo, Japan

[21] Appl. No.: 622,071

[22] Filed: Dec. 4, 1990

[30] Foreign Application Priority Data

Dec. 8, 1989 [JP] Japan ................... 1-319519

[51] Int. Cl.$^5$ ..................... H03M 1/36; H03K 5/23
[52] U.S. Cl. ..................... 341/122; 341/159; 307/353
[58] Field of Search ............... 341/122, 123, 155, 156, 341/158, 159, 172; 307/352, 353

[56] References Cited

U.S. PATENT DOCUMENTS

| | | | |
|---|---|---|---|
| 4,507,649 | 3/1985 | Dingwall et al. | 341/159 |
| 4,539,551 | 9/1985 | Fujita et al. | 341/158 |
| 4,547,763 | 10/1985 | Flamm | 341/159 |
| 4,612,531 | 9/1986 | Dingwall et al. | 341/159 |
| 4,845,383 | 7/1989 | Iida | 341/158 X |
| 4,903,028 | 2/1990 | Fukushima | 341/156 |

FOREIGN PATENT DOCUMENTS

| | | | |
|---|---|---|---|
| 01-117523 | 5/1989 | Japan | 341/159 |
| 02-41028 | 2/1990 | Japan | 341/155 |

OTHER PUBLICATIONS

"A CMOS 40 MHz 8b 105mW Two-Step ADC", by Noriyuki Fukushima et al., ISSCC Digest of Technical Papers, pp. 14-15, Feb. 1989.

*Primary Examiner*—Howard L. Williams
*Attorney, Agent, or Firm*—Lowe, Price, LeBlanc & Becker

[57] ABSTRACT

A single sampling switch i provided for a plurality of sample/hold function-equipped comparators. Thus, when the sampling switch is turned on, an analog signal is fed to each sample and hold circuit, and when it is turned off, the analog signal fed in at that time is sampled and held in each sample/hold function-equipped comparator. The analog signal values sampled and held in the sample/hold function-equipped comparators are averaged when the averaging switch is turned on. In this manner, since the timing for sampling and holding is controlled by the single sampling switch, a smaller number of switching elements are sufficient and the possibility of the timing for sampling and holding differing between the sample/hold function-equipped comparators is eliminated.

5 Claims, 6 Drawing Sheets

BINARY SIGNAL GENERATING CIRCUIT WITH PARALLEL SAMPLE AND HOLD CIRCUITS AND COMMON SAMPLING SWITCH

BACKGROUND OF THE INVENTION

1. Field of the Invention

This invention relates to a sample and hold circuit device wherein input analog signals are sampled and held in a plurality of sample and hold circuits, and it also relates to a binary signal generating circuit and an A/D converter using said sample and hold circuit device.

2. Description of the Background Art

FIG. 4 is a block diagram showing the general arrangement of an A/D converter for converting analog signals into digital signals. In this figure, an analog signal inputted from an analog signal source AS to an analog signal input terminal 1 is fed to the individual comparators in a comparators group CMPG. These comparators have applied thereto corresponding reference voltages from a reference voltage generating circuit RV via reference voltage input terminals $2l$–$2n$. Each comparator compares the input analog signal with the associated reference voltage and outputs a binary signal corresponding to the resulting value to output terminals $Ol$ through $On$. These binary signals are fed to an encoder EC. The encoder EC encodes the binary signals fed thereto and outputs digital signals corresponding to the inputted analog signals.

As for the sample/hold function-equipped comparators group CMPG shown in FIG. 4, there is known a sample/hold function-equipped voltage comparators group in an A/D converter shown, for example, in "A CMOS 40 MHz 8b 105 mW Two-Step ACD" (N. Fukushima et al., ISSCC Digest of Tech. Papers, pp 14–15, Feb., 1989). FIG. 5 is a circuit diagram showing the sample/hold function-equipped voltage comparators group shown in the above-mentioned publication. In this figure, this sample/hold function-equipped comparators group is provided with a plurality of sample/hold function-equipped comparators (hereinafter referred to simply as the comparators) CMPj ($j=1 \sim n$, hereinafter the same). The input ends of the comparators CMPj are interconnected and are connected to an analog signal input terminal 1. Interposed between the internal nodes Nj of the comparators CMPj and said interconnected input ends are sampling switches SSj. The sampling switches SSj are used to determine the timing for sampling and holding in the comparators CMPj. Further, interposed between the internal nodes Nj and the reference voltage input terminals $2j$ are reference voltage applying switches SCj. The reference voltage input terminals $2j$ are fed with reference voltages REFj corresponding to the comparators from a reference voltage generating circuit RV, as described above. The reference voltage applying switches SCj are switches for introducing corresponding reference voltages to the comparators CMPj. The internal nodes Nj are connected together by a line L1 through averaging switches SAj. The averaging switches SAj are switches for uniforming variations in the voltages at the nodes Nj during sampling and holding. Coupling capacitors Cj are connected at one of their respective ends to the internal nodes Nj and at the other ends to the input ends of inverters IVj. The output ends of the inverters IVj are connected to output terminals Oj. Further, interposed between the respective input and output ends of the inverters IVj are input/output shorting switches SFj.

Referring to a timing chart shown in FIG. 6, the operation of the conventional device shown in FIG. 5 will now be described. In brief, the conventional device shown in FIG. 5 operates in three phases: a first phase P1, a second phase P2 and a third phase P3. In the first phase P1, an analog signal is introduced into the comparators CMPi to prepare for sampling and holding. In the second phase P2, effected are the sampling and holding of the analog signal and the averaging of the analog signal values sampled and held in the comparators CMPj. In the third phase P3, the analog signal is converted into a binary value on the basis of the reference voltage. A description of the operation in each phase will now be given in more detail.

First, in the first phase P1, the reference voltage applying switches SCj alone are turned off, while the other switches SSj, SAj and SFj are turned on. The turning-on of the input/output shorting switches SFj causes the input and output ends to be shorted, so that the potentials at the input and output ends are equal to each other (this operation is called "autozero"). At this time, the input and output voltages of the inverters IVj have a predetermined voltage value Vb (usually, about Vdd/2, where Vdd is the power source voltage) which is determined by the transmission characteristics of the inverters IVj and the condition that output voltage=input voltage. The other electrodes of the coupling capacitors Cj have applied thereto the voltage Vb. On the other hand, when the sampling switches SSj are turned on, one of the respective electrodes of the coupling capacitors Cj have applied thereto analog signal voltage Vin. As a result, the coupling capacitors Cj are charged in accordance with the difference between the voltages Vb and Vin.

As soon as the second phase P2 is started upon completion of the first phase P1, the sampling switches SSj are turned off, and the voltages Vaj of the analog signals inputted to the comparators CMPj at this point in time are sampled and held. The sampled and held analog signal voltages Vaj must be equal for all comparators CMPj. However, in practice, owing to skew in control signals inputted to the sampling switches SSj and differences in characteristics between the sampling switches SSj, the analog voltages sampled and held differ between the comparators. For example, in the case of a semiconductor integrated circuit device, it is impossible to arrange all of the n sampling switches SSj at an equal distance from the control signal generating source (not shown); skew is produced in the application timing for control signals. Even if these control signals are inputted to the sampling switches SSj with the same timing, a difference in the threshold voltages for the transistors used as the sampling switches would result in a difference between the respective timings for turning off the sampling switches SSj and hence the analog voltages to be sampled would differ between the comparators CMPj. The second phase P2 is provided also for the purpose of averaging such different sampled and held values to ensure that there is no contradiction in the outputs of all comparators CMPj. In this second phase P2, the averaging switches SAj still remain turned on. For this reason, even if the internal nodes Nj take different voltage values as a result of the comparators CMPj sampling and holding different analog signal voltage values, the internal nodes Ni~Nn of all comparators CMPj take the same voltage value Va through the line L1 to which the averaging switches SAj are connected. On the other hand, since the input/output shorting switches SFj still remain turned on in this phase, the coupling capacitors Cj are charged by the same potential difference, i.e., the potential difference between Va and Vb in the comparators CMPj.

In the third phase P3, the sampling switches SSj, the averaging switches SAj, and input/output shorting switches SFj are turned off, while the reference voltage applying switches SCj are turned on. The turning off of the reference voltage applying switches SFj results in the impedances of the input sides of the inverters IVj becoming infinite. Further, one of the respective electrodes of the coupling capacitors Cj have applied thereto a reference voltage Vrefj in place of the sampled and held value Va. Therefore, the voltage changes (Vrefj−Va) produced in one of the respective electrodes of the coupling capacitors Cj are transmitted to the output sides of the coupling capacitors Cj and inverted and amplified by the inverters IVj. That is, when the amplification factors of the inverters IVj are sufficiently large, the outputs of the comparators CMPj are:

Vdd, if Vj > Vrefj and

Vss, if Vj < Vrefj where Vdd is the source voltage and Vss is the ground voltage. In the third phase P3, the voltage Va sampled and held in the second phase P2 is compared with the reference voltage Vefj in this manner, and binary signals (0 32 Vss, 1=Vdd) are outputted depending upon the result of comparison.

As described above, in the conventional sample/hold function-equipped comparators group used in A/C inverters, a sampling switch, an averaging switch and a reference voltage applying switch are provided for each comparator; thus, there has bee a problem that many switches are required, increasing the circuit area.

SUMMARY OF THE INVENTION

An object of this invention is to provide a sample and hold circuit device which can be constructed of a smaller number of switches than in the conventional device.

Another object of the invention is to provide an A/D converter having an improved sample/hold function-equipped comparators group.

A sample and hold circuit device according to the invention comprises a plurality of sample and hold circuits, an analog signal input terminal, a sampling switch, and a plurality of averaging switches. Each sample and hold circuit has an input end, such input ends being connected together, and an internal node for receiving an analog signal introduced from said input end. The analog signal input terminal feeds the sample and hold circuit with an analog signal which is to be sampled and held. The sampling switch is interposed between the interconnected input ends of the sample and hold circuits and the analog signal input terminal and is turned on thereby to introduce the analog signal into the sample and hold circuit and is turned off thereby to cause the analog signal introduced at that time to be sampled and held in the sample and hold circuit. Each averaging switch is interposed between the internal node of the sample and hold circuit and the interconnected input ends and is turned on thereby to interconnect the internal nodes, averaging the analog signal values sampled and held in the sample and hold circuits and is turned off thereby to electrically disconnect the internal nodes of the sample and hold circuits.

A binary signal generating circuit according to the invention comprises a plurality of sample and hold circuits, an analog signal input terminal, a plurality of averaging switches, a plurality of reference voltage applying switches, and a plurality of comparing means. The sample and hold circuits have their input ends connected together, each having an internal node for receiving an analog signal. The analog signal input terminal feeds a reference voltage to be sampled and held to the sample and hold circuits. The sampling switch is interposed between the interconnected input ends of the sample and hold circuit and the analog signal input terminal and is turned on thereby to introduce the analog signal into the sample and hold circuits and turned off thereby to cause the analog signal introduced at that time to be sampled and held in each sample and hold circuit. The averaging switches are interposed between the internal nodes of the sample and hold circuits and the interconnected input ends and are turned on thereby to interconnect the internal nodes and average the analog signals sampled and held in the sample and hold circuits and turned off thereby to electrically disconnect the internal nodes of the sample and hold circuit from each other. Each reference voltage applying switch is interposed between the internal node of the sample and hold circuit and the corresponding reference voltage input terminal and is turned on thereby to apply the reference voltage from the reference voltage input terminal to the internal node and turned off thereby to prevent the reference voltage from being applied to the internal node. Each comparator means is associated with each sample and hold circuit and compares the analog signal value sampled and held in the sample and hold circuit with the corresponding reference voltage fed in through the reference voltage applying switch and produce a binary signal having the corresponding size.

An A/D converter according to the invention comprises an analog signal input terminal, a plurality of sample and hold circuits, reference voltage generating means, a plurality of comparing means, encoding means, a sampling switch, and a plurality of averaging switches. The analog signal input terminal inputs analog signals. Sample and hold circuits have interconnected input ends, and internal nodes for receiving analog signals from said input ends. The reference voltage generating means generates a reference voltage to be imparted to each sample and hold circuit. Each comparing means is associated with each sample and hold circuit and compare the analog signal value sampled and held in each sample and hold circuit with the corresponding reference voltage fed in from the reference voltage generating means to produce a binary signal having the corresponding size. The encoding means converts the binary signal output of each comparing means to a digital signal corresponding to the inputted analog signal. The sampling switch is interposed between the interconnected input ends of the sample and hold circuits and the analog signal input terminal and is turned on thereby to introduce the analog signal into each sample and hold circuit and turned off thereby to cause the analog signal fed in at that time to be sampled and held in each sample and hold circuit. Each averaging switch is interposed between the internal node of each sample and hold circuit and the interconnected input ends and is turned on thereby to interconnect the internal nodes to average the analog signal values sampled and held in the sample and hold circuits and is turned off thereby to electrically disconnect the internal nodes of the sample and hold circuits. Each reference voltage applying switch is interposed between the internal node of the sample and hold circuit and the corresponding reference voltage input terminal and is turned on thereby to apply the reference voltage from the reference voltage input terminal to the internal node and turned off thereby to prevent the reference voltage from being applied to the internal node. Each comparing means is associated with each sample and hold circuit and compares the analog signal value sampled and held in each sample and hold circuit with the corresponding reference voltage fed in through the reference voltage applying switch and produce a binary signal having the corresponding size.

According to this invention, a single sampling switch is provided for a plurality of parallel-connected sample and hold circuits, said sampling switch controlling the respective sampling and holding timings for the sample and hold circuits; thus, as compared with the conventional device, the number of sampling switches can be reduced. Therefore, it is possible to minimize the circuit area and provide an inexpensive sample and hold circuit device, and a binary signal generating circuit and an A/D converter using the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
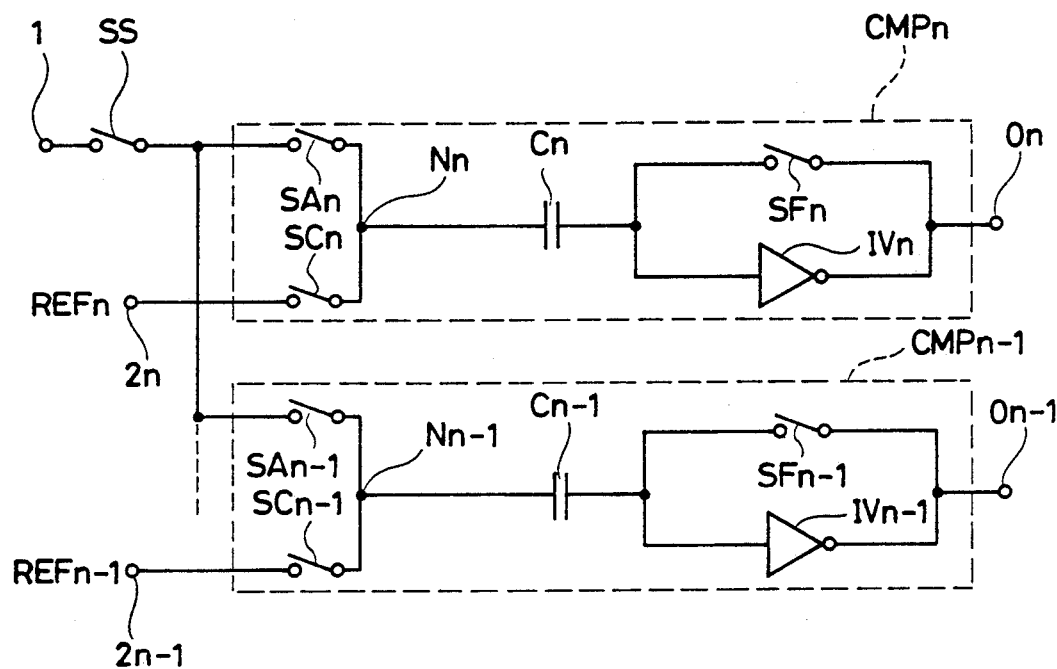
FIG. 1 is a circuit diagram showing the arrangement of an embodiment of the invention.
Figure 1:
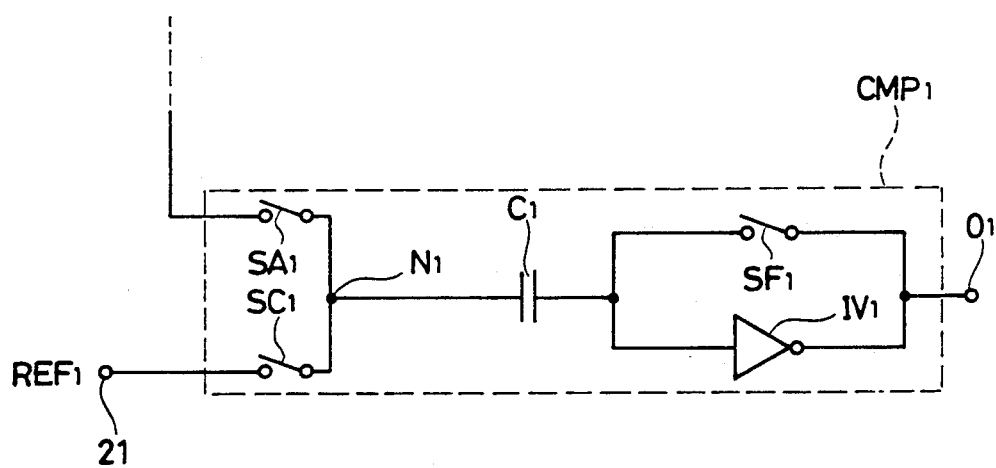
Figure 5:
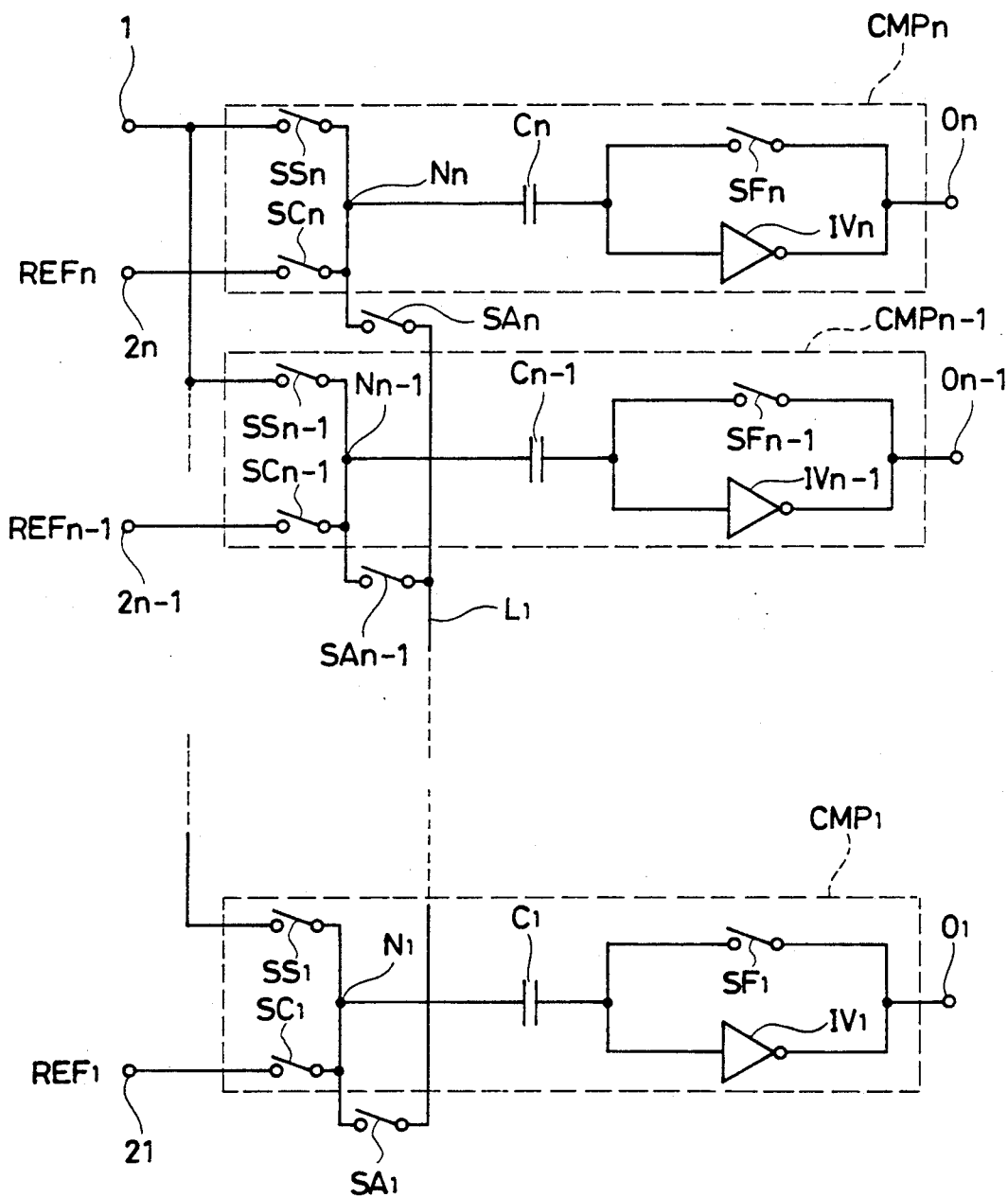
FIG. 5 is a circuit diagram showing the arrangement of a conventional sample/hold function-equipped comparators group.
Figure 6:
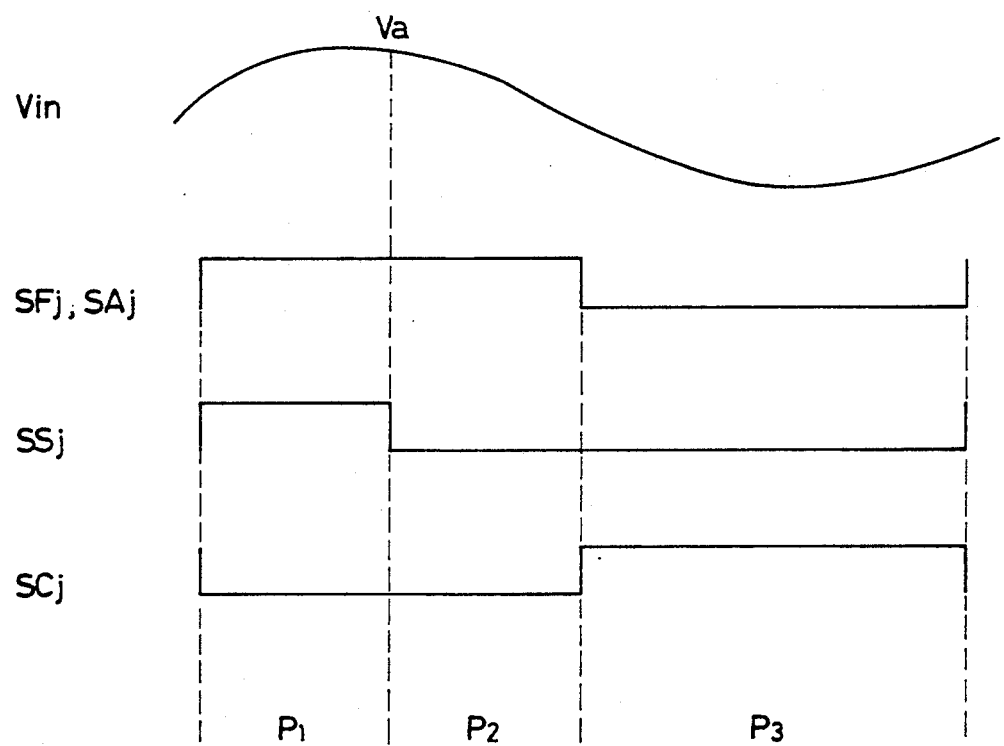
FIG. 6 is a timing chart for explaining the operation of the conventional device shown in FIG. 5.

FIG. 1 is a circuit diagram showing the arrangement of an embodiment of the invention. In the figure, in this embodiment, there is provided a single sampling switch SS between the interconnected input ends of comparators CMPj and an analog signal input terminal 1. Further, averaging switches SAj, unlike those in the conventional device shown in FIG. 7, are interposed between the interconnected input ends and internal nodes Nj. The rest of the arrangement is the same as in the conventional device shown in FIG. 5, and like reference numerals are applied to corresponding parts, and a description thereof will be omitted.

Figure 2:
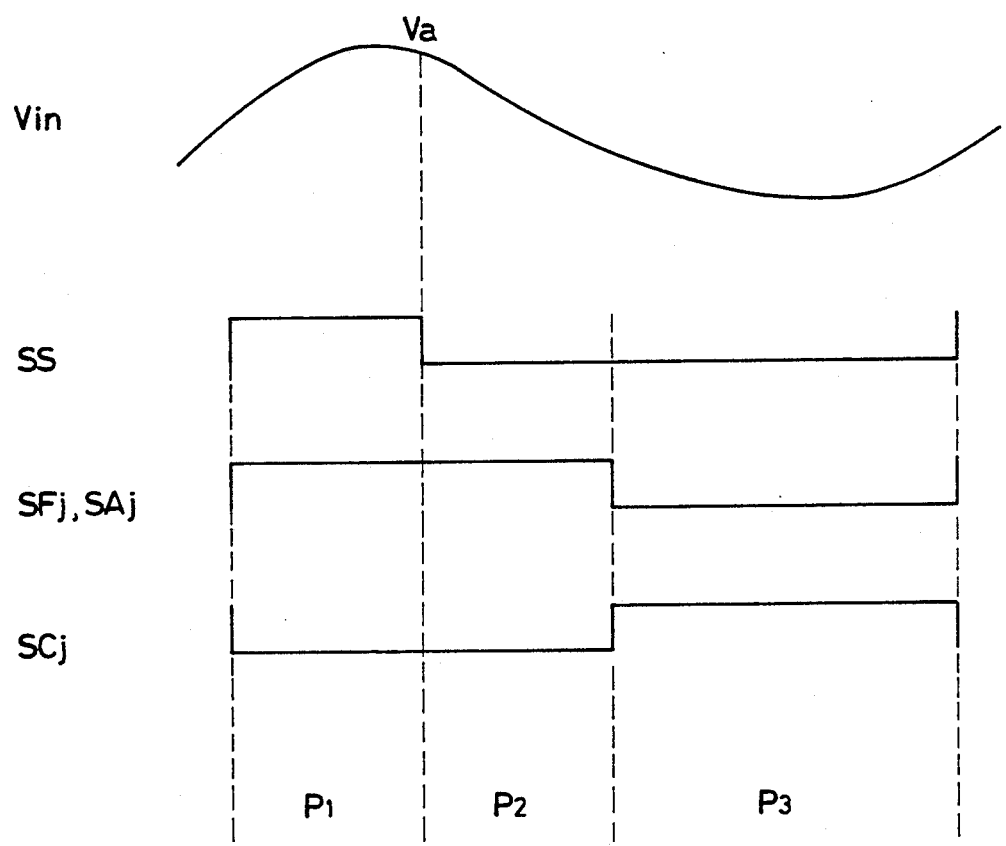
FIG. 2 is a timing chart for explaining the operation of the embodiment of FIG. 1.

Now, referring to the timing chart of FIG. 2, the operation of the embodiment shown in FIG. 1 will be described. This embodiment, like the conventional device, operates in three phases, i.e., first, second and third phases P1, P2 and P3.

First, in the first phase P1, the reference voltage applying switches SCj alone are turned off, with the other switches SS, SAj and SFj all turned on. Thereby, as in the conventional device of FIG. 5, the inverters IVj perform the autozero operation, so that the coupling capacitors have applied thereto at one of their respective ends the analog signal voltage Vin. At the same time as the second phase is started upon completion of the first phase, the sampling switch SS is turned off, and the analog signal voltage Va present at this point in time is sampled and held in the comparators CMPj. At this time, the timing for sampling and holding is controlled by the single sampling switch SS; therefore, there is no variation in sampled and held value due to a variation in the characteristics of the switch means and skew in control signal. Further, in the second phase P2, the averaging switches SAj and input/output shorting switches SFj remain turned on. Therefore, the analog signal voltages sampled and held at the start of the second phase P2 are averaged through the input ends of the comparators CMPj. Thus, the sampled and held values applied to one of the respective input terminals of the coupling capacitors Cj take the same value Va for all comparators.

In the third phase P3, the sampling and holding switches SS, the averaging switches SAj and the input/output shorting switches SFj are turned off, while the reference voltage applying switches SCj are turned on. At this time, a comparison is made between the sampled and held values averaged in the second phase P2 and the reference voltages Vrefj, the results being outputted in the form of binary signals. The comparing operation is the same as in the conventional device of FIG. 5.

The embodiment shown in FIG. 1 is generally used as sample/hold function-equipped comparators group CMPj. However, the embodiment of FIG. 1 is applicable also to other devices, of course. For example, it may be used as a driver for LED indicators. In this case, a plurality of LEDs are linearly arranged and the lighting of the LEDs is effected in accordance with binary signals delivered from the output terminals Oj; then, the levels of analog signals inputted from the analog input terminal 1 can be represented in bar graph.

Figure 3:
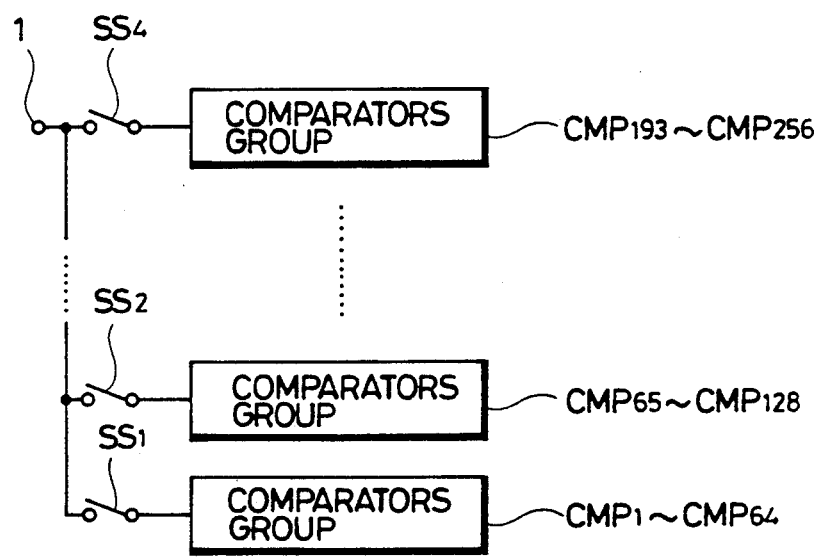
FIG. 3 is a block diagram showing the general, outlined arrangement of another embodiment of the invention.
Figure 4:
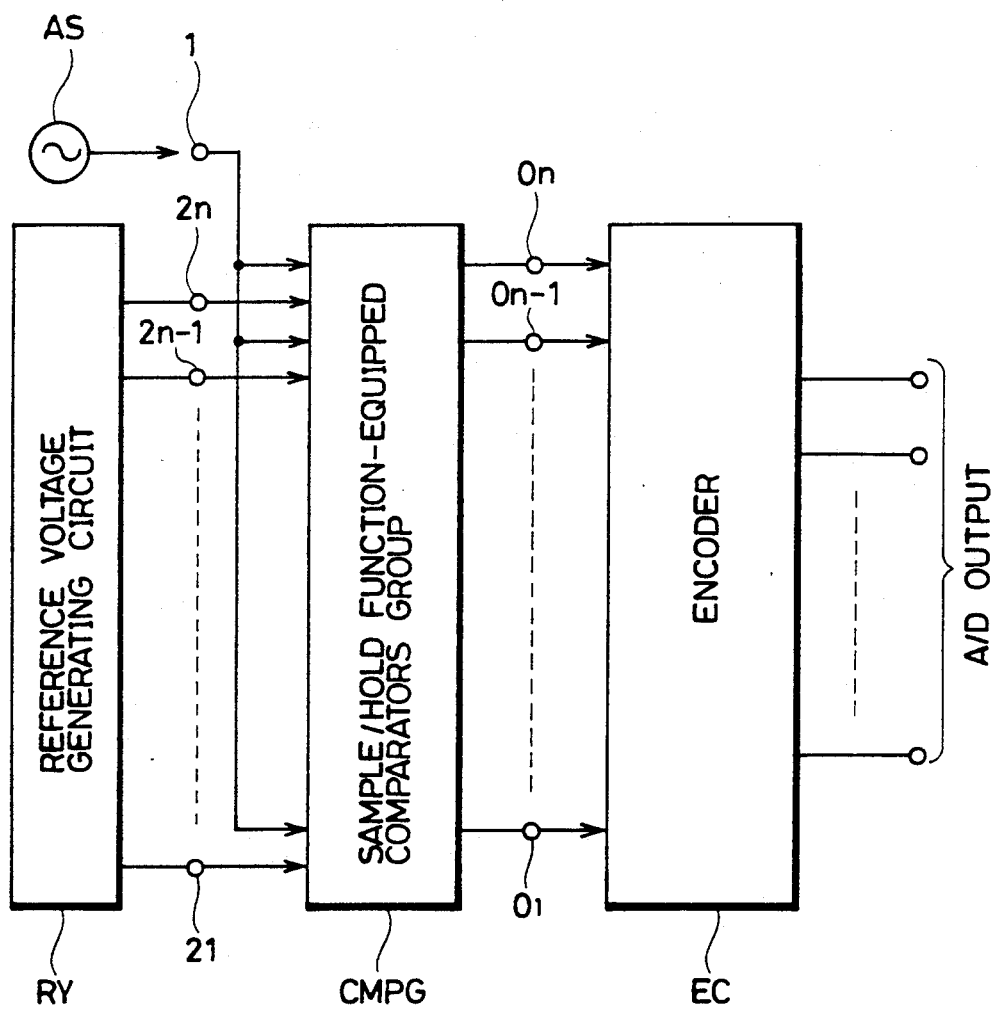
FIG. 4 is a block diagram showing the general arrangement of an A/D converter.

In the embodiment of FIG. 1, a single sampling switch has been provided for the analog signal input terminal 1, however, a plurality of sampling switches may be parallel-connected, with each sampling switch being associated with a comparators group shown in FIG. 1. For example, as shown in FIG. 3, 256 comparators are divided into four groups, each consisting of 64 comparators, and sampling switches SS1 through SS4 are disposed each between the associated comparators group and the analog signal input terminal 1. In this case, the input ends of the comparators included in each comparator group are interconnected. In the case where there is a large number of binary signals to be produced, dividing a plurality of comparators into groups allows the use of a sampling switch which is low in driving power.

As has been described so far, according to this invention, since the use of a single sampling switch is insufficient for parallel-connected sample and hold circuits, the number of switches can be reduced as compared with the conventional device and hence the circuit area can be minimized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sample and hold circuit device including a plurality of sample and hold circuits which are parallel-connected, wherein:

each of said sample and hold circuits has an input end connected to the input ends of the other sample and hold circuits, and an internal node for receiving an analog signal fed in through said input end, said device comprising an analog signal input terminal for inputting the analog signal to be sampled and held in said sample and hold circuits, a sampling switch interposed between said connected input ends of the sample and hold circuits and said analog signal input terminal and adapted to be turned on thereby to introduce said analog signal into the sample and hold circuits and turned off thereby to cause the analog signal fed in at that time to be sampled and held in the sample and hold circuits, and a plurality of averaging switches interposed between said internal nodes and said interconnected input ends of said sample and hold circuits and adapted to be turned on thereby to interconnect said internal nodes and average the analog signal values sampled and held in the sample and hold circuits and turned off thereby to electrically disconnect said internal nodes of said sample and hold circuits from each other.

2. A sample and hold circuit device as set forth in claim 1, wherein:

for said analog signal input terminal, there are provided a plurality of sets of said sample and hold circuits groups having their input ends interconnected, said sampling switch is provided separately from the sets of said sample and hold circuits groups.

3. A binary signal generating circuit for generating a binary signal corresponding to an input analog signal, comprising:

a plurality of sample and hold circuits having their input ends interconnected, said sample and hold circuits having internal nodes for receiving analog signals fed from said input ends, an analog signal input terminal for inputting an analog signal to be sampled and held in the sample and hold circuits, a plurality of reference voltage input terminals for inputting reference voltages to be imparted to said sample and hold circuits, a sampling switch interposed between said interconnected input ends of said sample and hold circuits and said analog signal input terminal and adapted to be turned on thereby to introduce said analog signal into said sample and hold circuits and turned off thereby to cause the analog signal fed in at that time to be sampled and held in the sample and hold circuits, a plurality of averaging switches interposed between said internal nodes and said interconnected input ends of said sample and hold circuits and adapted to be turned on thereby to interconnect said internal nodes and average the analog signal values sampled and held in the sample and hold circuits and turned off thereby to electrically disconnect said internal nodes of said sample and hold circuits, a plurality of reference voltage applying switches interposed between said internal nodes of said sample and hold circuits and the corresponding reference voltage input terminal and adapted to be turned on thereby to apply reference voltages from the reference voltage input terminals to the internal nodes and turned off thereby to prevent the reference voltages from being applied to the internal nodes, and a plurality of comparing means associated with said sample and hold circuits and adapted to compare the analog signal values sampled and held in the sample and hold circuits with the corresponding reference voltages and generate a binary signal having the corresponding size.

4. An A/D converter for converting an input analog signal to a digital signal, comprising:

an analog signal input terminal for inputting said analog signal.

a plurality of sample and hold circuits for sampling and holding the analog signal inputted from the analog signal input terminal, reference voltage generating means for generating reference voltages to be imparted to said sample and hold circuits, a plurality of comparing means associated with said sample and hold circuits and adapted to compare the analog signal values sampled and held in the sample and hold circuits with the corresponding reference voltages imparted from said reference voltage generating means and generate a binary signal having the corresponding size, and encoding means for converting the binary signal outputs from said comparing means into digital signals corresponding to said inputted analog signals, said sample and hold circuits having their input ends interconnected, and internal nodes for receiving analog signals introduced from said input ends, a sampling switch interposed between the interconnected input ends of said sample and hold circuits and said analog signal input terminal and adapted to be turned on thereby to introduce said analog signal into said sample and hold circuits and turned off thereby to cause the analog signals introduced at that time to be sampled and held in the sample and hold circuits, and a plurality of averaging switches interposed between the internal nodes and the interconnected input ends of said sample and hold circuits and adapted to be turned on thereby to connect said internal nodes to each other and average the analog signal values sampled and held in the sample and hold circuits and turned off thereby to electrically disconnect said internal nodes of said sample and hold circuits from each other.

5. An A/D converter as set forth in claim 4, including a plurality of reference voltage applying switches each associated with each sample and hold circuit and adapted to be turned on thereby to apply the corresponding reference voltage from said reference voltage generating circuit to said internal nodes and turned off thereby to prevent the corresponding reference voltage from being applied to said internal nodes.

* * * * *